United States Patent [19]

Bhandari

[11] Patent Number: 5,264,847
[45] Date of Patent: Nov. 23, 1993

[54] DATA DECODER

[75] Inventor: Rajan Bhandari, Basingstoke, United Kingdom

[73] Assignee: Sony United Kingdom Ltd., Staines, United Kingdom

[21] Appl. No.: 925,179

[22] Filed: Aug. 6, 1992

[30] Foreign Application Priority Data

Oct. 4, 1991 [GB] United Kingdom ............... 9121122

[51] Int. Cl.$^5$ ............................................. H03M 7/44
[52] U.S. Cl. .................................... 341/81; 341/87
[58] Field of Search .................. 341/81, 59, 63, 55, 341/95; 358/261.1, 426, 427

[56] References Cited

U.S. PATENT DOCUMENTS 5,181,031  1/1993  Tong et al. ........................ 341/65

Primary Examiner—A. D. Pellinen
Assistant Examiner—Brian K. Young
Attorney, Agent, or Firm—William S. Frommer; Alvin Sinderbrand

[57] ABSTRACT

A data decoder is described for decoding interleaved first type code words [RUNLENGTH, SIZE] and second type code words [AMPLITUDE], each first type code word serving to define a runlength of constant values preceding a variable value defined by a following second type code word. The first type code words and the second type code words are fed to respective first and second pipeline delay units 22 and 24. The output from the first pipeline delay unit 22 is fed to a state machine 26 which reads the RUNLENGTH value and generates an INSERT ZEROS signal for a period proportional to the RUNLENGTH value followed by a signal triggering reading of the second pipeline delay unit 24. The INSERT ZEROS signal and the output of the second pipeline delay unit 24 are fed to a multiplexer 28 which selects between them to generate the appropriate OUTPUT signal. A swing buffer 10 is disposed upstream of the first and second pipeline delay units 22 and 24. The second pipeline delay unit 24 is also used to effect fixed length code decoding.

8 Claims, 2 Drawing Sheets

| FIRST | SECOND | SIZE | READ | INSERT ZEROS | OUTPUT |
|---|---|---|---|---|---|
| [6,4] | [11] | 4 | F | T | 0 |
| [6,4] | [11] | 4 | F | T | 0 |
| [6,4] | [11] | 4 | F | T | 0 |
| [6,4] | [11] | 4 | F | T | 0 |
| [6,4] | [11] | 4 | F | T | 0 |
| [6,4] | [11] | 4 | F | T | 0 |
| [6,4] | [11] | 4 | T | F | 11 |
| [4,3] | [6] | 3 | F | T | 0 |
| [4,3] | [6] | 3 | F | T | 0 |
| [4,3] | [6] | 3 | F | T | 0 |
| [4,3] | [6] | 3 | F | T | 0 |
| [4,3] | [6] | 3 | T | F | 6 |
| [5,3] | [5] | 3 | F | T | 0 |
| ⋮ | ⋮ | ⋮ | ⋮ | ⋮ | ⋮ |

DATA DECODER

BACKGROUND OF THE INVENTION

1. Field of the Invention

This invention relates to the field of data decoding. More particularly, this invention relates to the field of the decoding of data composed of interleaved first type code words and second type code words, in which each first type code word defines a runlength of constant values preceding a variable value defined by a following second type code word.

2. Description of the Prior Art

It is known to provide data encoding techniques which generate data in the form of interleaved first type code words and second-.type code words. An example of such an encoding technique is that proposed by the Joint Photographic Experts Group (JPEG) and currently under review by the International Standards Organisation.

The JPEG standard is intended for the compression of image data in computer systems. The image data is initially transformed into the spatial frequency domain by discrete cosine transformation. The ac spatial components have a distinctly different character to the dc spatial components. The ac spatial components are subject to runlength coding to exploit the long runs of zero values in this data. The dc spatial components do not show this characteristic.

The JPEG standard proposes the use of first and second type code words with the following syntax for the ac data, i.e.

[RUNLENGTH, SIZE], [AMPLITUDE]

In this case RUNLENGTH is the number of zeros preceding a nonzero value. SIZE is the number of bits that will be needed to represent the non-zero value. AMPLITUDE is the non-zero value and has a bit length equal to the specified by SIZE.

Consider the following data stream of image data,

... .0,0,0,7,0,0,0,0,0,0,11,0,0,0 ...

The middle portion, comprising six zeros followed by a non-zero value of 11, would be encoded with the value of RUNLENGTH=6 representing the six zeros. The non-zero value of 11 will require four bits to represent it, and so SIZE=4. The value of AMPLITUDE is 11, or 1011 in binary. Thus, the sequence 0,0,0,0,0,0,11 is encoded as [6,4], [11]. The [6,4] is a first type code word and the [11] is a second type code word.

Whilst the JPEG standard yields good compression performance, it gives rise to decoding problems in some circumstance. The JPEG standard is primarily intended for image display in computer systems. Computer systems can carry out essentially non-real time decoding of the compressed data by reading it into memory and then scanning through it to reconstruct the non-compressed data as a separate, nonsynchronous operation. Such an approach to decoding does not work well in real time video systems.

One problem is that the volume of image data in a video system is much higher. Whereas a computer system can store and then process a single image without processing speed limitations becoming noticeable, a video system typically has to process the equivalent of thirty such images every second to keep pace with the video data stream.

In addition, there is the problem that the decoding of the compressed data should produce an output data stream with a constant data rate matching the video data rate of the apparatus that will subsequently display the data. Accordingly, the system must be able to cope with the fact that the ratio between the number of bits of input data to the number of bits of decoded data generated is not constant. The ratio can very significantly depending on factors such as the information content of each image, or how well the compression and coding techniques match a particular part of the data stream.

It is an object of the invention to provide a high speed data decoder capable of producing a constant data rate output.

SUMMARY OF THE INVENTION

Viewed from one aspect the invention provides a data decoder for decoding interleaved first type code words and second type code words, each said first type code word serving to define a runlength of constant values preceding a variable value defined by a following second type code word, said data decoder comprising:

(i) a first pipeline delay unit for buffering said first type code words;

(ii) a second pipeline delay unit for buffering said second type code words:

(iii) a multiplexer for selecting for output between values generated from code words within said first pipeline delay unit and said second pipeline delay unit; and (iv) a state machine responsive to a first type code word read from said first pipeline delay unit for generating a run of constant values as defined by said first type code word for output via said multiplexer followed by a signal for switching said multiplexer to read a variable value defined by a second type code word from said second pipeline delay unit.

This hardware approach to the decoding allows the required overall data rate to be met and allows a constant video rate output to be achieved.

It may be that the data has undergone decoding and processing steps prior to reaching the data decoding stage of the present invention. In these circumstances the previous steps can impose a variation in the rate at which code words are fed to the decoder. In turn this can effect the ability to maintain the constant video rate output. To help overcome this problem, preferred embodiments of the invention further comprise a swing buffer for buffering fields of data composed of a plurality of first type code words and second type code words prior to passing these to said first pipeline delay unit and said second pipeline delay unit respectively.

As well as performing a buffering function the pipeline delay units can, in the interests of efficiency, be used to carry out other jobs. Thus, in preferred embodiments of the invention said second pipeline delay unit also performs a decoding operation on said second type code words as they pass through said second pipeline delay unit.

If the second pipeline delay unit is carrying some decoding of its own, then the interdependence of the two different types of code word may have to be dealt with. In preferred embodiments in which each said first type code word defines the bit length of a following second type code word, a signal indicative of said bit length is fed to said second pipeline delay unit for use in decoding said second type code words.

In the case of a system for handling JPEG type data, said second pipeline delay unit is a fixed length code decoder, said constant values are zeros and said variable values are non-zeros.

Viewed from another aspect the invention provides a data decoding method for decoding interleaved first type code words and second type code words, each said first type code word serving to define a runlength of constant values preceding a variable value defined by a following second type code word, said data decoding method comprising the steps of:

(i) buffering said first type code words in a first pipeline delay unit;

(ii) buffering said second type code words in a second pipeline delay unit;

(iii) selecting with a multiplexer for output between values generated from code words within said first pipeline delay unit and said second pipeline delay unit;

(iv) reading with a state machine a first type code word from said first pipeline delay unit; and (v) generating with said machine a run of constant values as defined by said first type code word for output via said multiplexer followed by a signal for switching said multiplexer to read a variable value defined by a second type code word from said second pipeline delay unit.

The above, and other objects, features and advantages of this invention will be apparent from the following detailed description of illustrative embodiments which is to be read in connection with the accompanying drawings.

DESCRIPTION OF THE PREFERRED EMBODIMENTS

Figure 1:
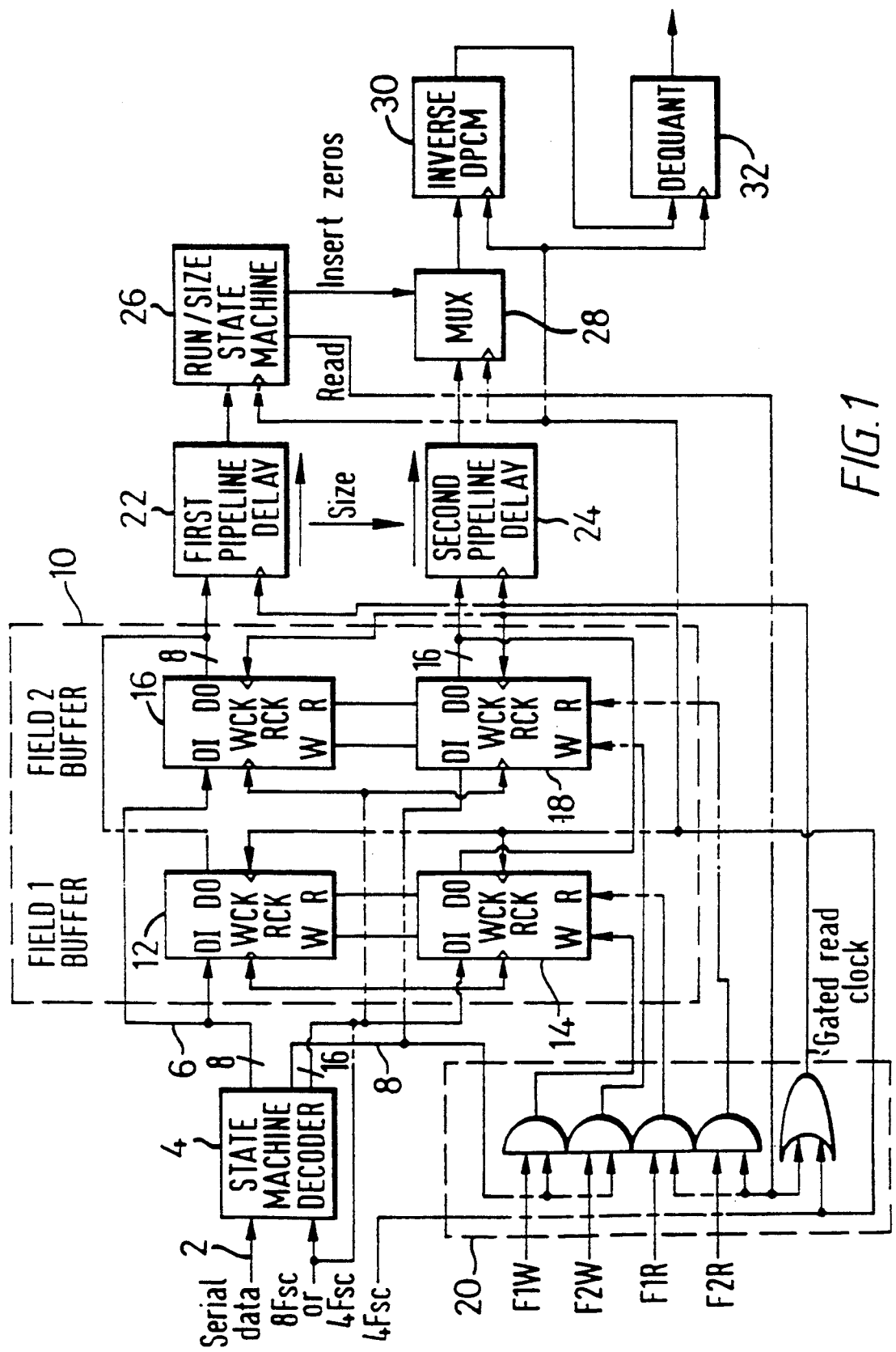
FIG. 1 represents a complete data decoding system.

Referring to FIG. 1, a stream of JPEG ac component data is input as serial data along line 2 to a state machine decoder 4. The state machine decoder Huffman decodes the serial data into first type code words with an eight bit width onto line 6 and second type code words with a sixteen bit width onto line 8. The state machine decoder can be of the type described in co-pending British Patent Application No. 9121123.5, which corresponds to U.S. patent application Ser. No. 07/924,925, (entitled SERIAL DATA DECODER; inventors R Bhandari, J M Soloff and J J Stone; applicant Sony Broadcast and Communications Limited; and filed on the same day as the present application).

The code words output from the state machine decoder 4 are passed to a swing buffer 10. RAMs 12 and 14 store the first type code words and second type code words of Field 1 respectively. RAMs 16 and 18 store the first type code words and second type code words of Field 2 respectively. A timing signal generator 20 produces Field 1 and 2 read/write control signals which are fed to the swing buffer 10 to control which side of the swing buffer is being written to and which side is being read from at any point in time.

The first type code words are fed from the RAMs 12 and 16 to the first pipeline delay unit 22. The second type code words from the RAMs 14 and 18 are fed to the second pipeline delay unit 24. At the start of decoding of each field the two pipeline delay units 22 and 24 are preloaded with code words so as to be ready to immediately generate decoded output as soon as the next field period is started.

The first type code word currently at the output end of the first pipeline delay unit 22 is fed to the state machine 26. The state machine 26 responds to this input by generating an INSERT ZEROS signal for a time period proportional to the RUNLENGTH value of the currently input first type code word. At the end of this period the state machine removes this signal which causes the multiplexer 28 to switch to reading the second type code word from the second pipeline delay unit 24. At the same time the state machine issues a READ signal which causes the code words within the pipeline delay units to advance by one position. The code word pair that has just been decoded will be discarded from the output ends of the pipelines 22 and 24 whilst a new code word pair will be loaded into the pipelines 22 and 24 from the appropriately selected side of the swing buffer 10.

The output from the multiplexer 28 is then subject to further decoding. In this case by inverse discrete pulse code modulator 30 and dequantiser 32.

Figures 2, 3:
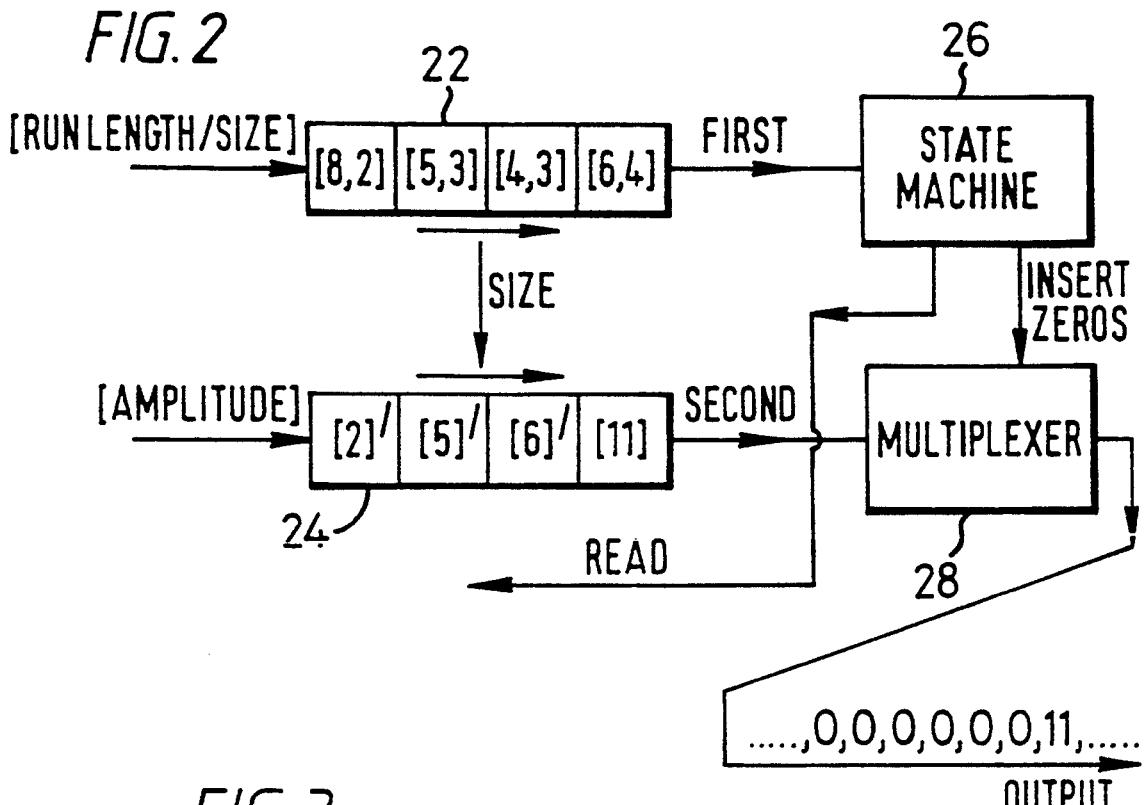
FIG. 2 shows in more detail a part of the circuit of FIG. 1.
FIG. 3 illustrates a sequence of signal values on the signal lines of FIG. 2.

FIG. 2 shows a portion of the circuit of FIG. 1 in more detail. The first pipeline delay unit 22 stores four first type code words. The second pipeline delay unit 24 stores four second type code words. The total delay of each pipeline is the same so as to maintain the same relative phase between the pairs of first type code words and second type code words. The second pipeline delay unit 24 is arranged to carry out fixed length code decoding (as described in the JPEG standard) as it passes the second type code words along its length. The second pipeline delay unit 24 is fed with the appropriate SIZE values from the first pipeline delay unit 22 for use in the fixed length code decoding carried out by the second pipeline delay unit 24. The second type code words marked with a prime are intended to show that they have not yet completed this decoding.

The first type code word which is at the output end of the first pipeline delay unit 22 is input to the state machine 26. In this case, the initial input is the code word [6, 4]. The state machine 26 responds to this input by maintaining the INSERT ZEROS signal true for a period sufficient to cause the multiplexer 28 to output six zero values as specified in the runlength variable of the first type code word.

At the end of this runlength period the state machine 26 triggers the multiplexer 28 to read the paired second type code word [11] from the second pipeline delay unit 24. At the same time that the second type code word is being read, the state machine 26 issues a READ signal to trigger the code words to advance along the pipeline delay unit 22 and 24 and the reading in of new code words from the swing buffer 10.

In this way, code word pairs are simultaneously presented to both the state machine 26 and the multiplexer 28. The state machine 26 reads the first type code word to control the appropriate number of zeros to be inserted and then triggers the reading of the second type code word. It is important that the code words be simultaneously available at the state machine 26 and the multiplexer 28 since the runlength could be specified to have zero duration. In this case, the state machine 26 would cause the multiplexer 28 to immediately read the second type code word.

FIG. 3 shows the sequence of signal values during the decoding of some of the code words illustrated in FIG. 2. The first code word [6, 4] and the second code word [11] are maintained on the lines FIRST and SECOND for seven clock periods. During all of these clock periods the SIZE value is held at four to enable the second pipeline delay unit 24 to appropriately decode the second type code word knowing the number of bits of its data that are significant. The READ signal remains false for the first six clock periods and then turns true for the last clock period. The READ signal triggers the advancing of the data through the pipeline delay units 22 and 24 once each code word pair has been fully decoded.

The INSERT ZEROS signal is true for the first six clock periods corresponding to the specified runlength of six and then turns false for one clock period. The multiplexer 28 responds to the turning false of the INSERT ZEROS signal by reading the second code word [11] onto the output line.

When the READ signal has triggered the advancement of all the code words along the pipeline delay units 22 and 24, the next code word pair to be decoded is [4, 31], [6]. This code word pair specifies a runlength of four zero values, a non zero value bit length of three and a non zero value amplitude of six. The decoder responds with a sequence of FFFFT for the READ signal and a sequence of TTTTF for the INSERT ZEROS signal. The OUTPUT signal produced by the multiplexer 28 is 0, 0, 0, 0, 6.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. A data decoder for decoding interleaved first type code words and second type code words, each said first type code word serving to define a runlength of constant values preceding a variable value defined by a following second type code word, said data decoder comprising:
   (i) a first pipeline delay unit for buffering said first type code words;
   (ii) a second pipeline delay unit for buffering said second type code words;
   (iii) a multiplexer for selectively outputting values generated from code words within said first pipeline delay unit and from code words within said second pipeline delay unit; and
   (iv) a state machine responsive to a first type code word read from said first pipeline delay unit for generating a run of constant values as defined by said first type code word for output via said multiplexer followed by a signal for switching said multiplexer to read a variable value defined by a second type code word from said second pipeline delay unit.

2. A data decoder as claimed in claim 1, further comprising a swing buffer for buffering fields of data composed of a plurality of first type code words and a plurality of second type code words prior to passing said first type code words and said second type code words to said first pipeline delay unit and said second pipeline delay unit respectively.

3. A data decoder as claimed in claim 1, wherein said second pipeline delay unit also performs a decoding operation on said second type code words as said second type code words pass through said second pipeline delay unit.

4. A data decoder as claimed in claim 3, wherein each said first type code word also defines the bit length of a following second type code word, and wherein a signal indicative of said bit length is fed to said second pipeline delay unit for use in decoding said second type code words.

5. A data decoder as claimed in claim 3, wherein said second pipeline delay unit is a fixed length code decoder.

6. A data decoder as claimed in claim 1, wherein said constant values are zeros and said variable values are non-zeros.

7. An image data decompression apparatus including a data decoder as claimed in claim 1.

8. A data decoding method for decoding interleaved first type code words and second type code words, each said first type code word serving to define a runlength of constant values preceding a variable value defined by a following second type code word, said data decoding method comprising the steps of:
   (i) buffering said first type code words in a first pipeline delay unit;
   (ii) buffering said second type code words in a second pipeline delay unit;
   (iii) reading with a state machine a first type code word from said first pipeline delay unit;
   (iv) generating with said state machine a run of constant values defined by said first type code word for output via a multiplexer followed by a signal for switching said multiplexer to read a variable value defined by a second type code word from said second pipeline delay unit for output via said multiplexer; and
   (v) outputting said constant values and said variable value via said multiplexer.

* * * * *